(12) United States Patent
Nagel et al.

(10) Patent No.: US 10,937,932 B2
(45) Date of Patent: Mar. 2, 2021

(54) OPTOELECTRONIC COMPONENT AND METHOD OF PRODUCING AN OPTOELECTRONIC COMPONENT

(71) Applicant: OSRAM Opto Semiconductors GmbH, Regensburg (DE)

(72) Inventors: Peter Nagel, Regensburg (DE); Klaus Reingruber, Langquaid (DE); Simone Brantl, Roding (DE); Konrad Wagner, Regensburg (DE); Ralf Müller, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/286,100

(22) Filed: Feb. 26, 2019

(65) Prior Publication Data
US 2019/0267519 A1   Aug. 29, 2019

(30) Foreign Application Priority Data

Feb. 27, 2018   (DE) ...................... 10 2018 104 381.3

(51) Int. Cl.
*H01L 33/54*   (2010.01)
*H01L 33/50*   (2010.01)
*H01L 33/60*   (2010.01)

(52) U.S. Cl.
CPC .............. *H01L 33/54* (2013.01); *H01L 33/50* (2013.01); *H01L 33/60* (2013.01); *H01L 2933/005* (2013.01); *H01L 2933/0058* (2013.01)

(58) Field of Classification Search
CPC ......... H01L 33/56; H01L 33/60; H01L 33/50; H01L 33/54; H01L 2933/0041; H01L 2933/005; H01L 2933/0058

USPC ....... 257/98, 99, 100; 438/22, 25, 26, 27, 29
See application file for complete search history.

(56) References Cited

U.S. PATENT DOCUMENTS

| 2010/0244065 A1* | 9/2010 | Butterworth ............ H01L 33/00 257/98 |
| 2015/0179876 A1 | 6/2015 | Hu et al. |
| 2018/0090649 A1* | 3/2018 | Nishioka ................ H01L 33/58 |

FOREIGN PATENT DOCUMENTS

| JP | 2015-8329 A | 1/2015 |
| WO | 2016/094422 A1 | 6/2016 |

OTHER PUBLICATIONS

Haglund, Erik., "VCSELs for High-Speed, Long-Reach, and Wavelength Optical Interconnects," Chalmers University of Technology, 2015.

* cited by examiner

*Primary Examiner* — Thinh T Nguyen
(74) *Attorney, Agent, or Firm* — DLA Piper LLP (US)

(57) ABSTRACT

An optoelectronic component includes a carrier, an optoelectronic arrangement, and a potting material, wherein the optoelectronic arrangement includes an optoelectronic semiconductor chip, the optoelectronic arrangement is arranged above a top side of the carrier, the potting material is arranged above the top side of the carrier such that the optoelectronic arrangement is embedded into the potting material, a radiation emission face of the optoelectronic arrangement is not covered by the potting material, and a surface of the potting material is formed above the radiation emission face in relation to the top side of the carrier.

9 Claims, 4 Drawing Sheets

OPTOELECTRONIC COMPONENT AND METHOD OF PRODUCING AN OPTOELECTRONIC COMPONENT

TECHNICAL FIELD

This disclosure relates to an optoelectronic component and to a method of producing an optoelectronic component.

BACKGROUND

Optoelectronic components provided to generate the highest possible brightness contrast between a luminous surface and an environment of the luminous surface are known. This may be achieved, for example, by arranging the luminous surface at a packaging edge. A further possibility consists in arranging additional structures. By way of example, a shadow mask may define a bright-dark boundary. Furthermore, the use of black materials to increase the brightness contrast is known.

It could therefore be helpful to provide an optoelectronic component comprising improved brightness contrast and a method of producing an optoelectronic component comprising improved brightness contrast.

SUMMARY

We provide an optoelectronic component including a carrier, an optoelectronic arrangement, and a potting material, wherein the optoelectronic arrangement includes an optoelectronic semiconductor chip, the optoelectronic arrangement is arranged above a top side of the carrier, the potting material is arranged above the top side of the carrier such that the optoelectronic arrangement is embedded into the potting material, a radiation emission face of the optoelectronic arrangement is not covered by the potting material, and a surface of the potting material is formed above the radiation emission face in relation to the top side of the carrier.

We also provide a method of producing an optoelectronic component including providing a carrier, arranging an optoelectronic arrangement above a top side of the carrier, wherein the optoelectronic arrangement includes an optoelectronic semiconductor chip, arranging a sacrificial body above a radiation emission face of the optoelectronic arrangement, embedding the optoelectronic arrangement and the sacrificial body into a potting material, wherein a surface of the potting material is formed above the radiation emission face of the optoelectronic arrangement in relation to the top side of the carrier, and removing the sacrificial body.

LIST OF REFERENCE SIGNS 1 optoelectronic component in accordance with the first example
2 optoelectronic component in accordance with the second example
3 optoelectronic component in accordance with the third example
4 carrier
5 top side of the carrier
6 optoelectronic arrangement
7 optoelectronic semiconductor chip of the optoelectronic arrangement
8 top side of the optoelectronic semiconductor chip
9 underside of the optoelectronic semiconductor chip
10 side faces of the optoelectronic semiconductor chip
11 wavelength-converting material of the optoelectronic arrangement
12 surface of the wavelength-converting material
13 side faces of the wavelength-converting material
14 radiation emission face of the optoelectronic arrangement
15 bond wire
16 first contact element
17 second contact element
18 sacrificial body
19 first sacrificial material of the sacrificial body
20 second sacrificial material of the sacrificial body
21 potting material
22 surface of the potting material
23 cavity between radiation emission face and potting material
24 dam
25 photoresist
26 illuminated section of the photoresist
27 unilluminated section of the photoresist
28 electromagnetic radiation
29 shadow mask
30 opening of the shadow mask
31 surface of the sacrificial body
32 underside of the carrier 33 wall of the potting material
34 surface of the photoresist
35 upper edge of the dam

DETAILED DESCRIPTION

Our optoelectronic component comprises a carrier, an optoelectronic arrangement and a potting material. The optoelectronic arrangement comprises an optoelectronic semiconductor chip. The optoelectronic arrangement is arranged above a top side of the carrier. The potting material is arranged above the top side of the carrier such that the optoelectronic arrangement is embedded into the potting material. A radiation emission face of the optoelectronic arrangement is not covered by the potting material. A surface of the potting material is formed above the radiation emission face in relation to the top side of the carrier.

Compared to an optoelectronic component whose radiation emission face lies in one plane with the surface of the potting material, the optoelectronic component whose radiation emission face is formed below the surface of the potting material advantageously comprises an improved brightness contrast between the radiation emission face and an environment of the radiation emission face. This advantage is achieved by the fact that electromagnetic radiation emitted and laterally radiated at the radiation emission face may be reflected at the potting material. However, there may also be an example where the electromagnetic radiation must propagate through the potting material, as a result of which a part of the electromagnetic radiation may be absorbed in the potting material.

Compared to the optoelectronic component whose radiation emission face lies in one plane with the surface of the potting material, the brightness contrast of the optoelectronic component comprising the more deeply located radiation emission face may be higher by a factor of 2.

The optoelectronic arrangement may comprise a wavelength-converting material. The wavelength-converting material is arranged on the optoelectronic semiconductor chip. The radiation emission face is a surface of the wavelength-converting material.

The wavelength-converting material is advantageously configured to modify a part of the electromagnetic radiation emitted by the optoelectronic semiconductor chip with regard to a wavelength. By way of example, the wavelength-converting material may be configured to convert blue light emitted by the optoelectronic semiconductor chip into yellow light. This may make it possible that overall white light may be radiated by the optoelectronic component.

A laterally directed emission of electromagnetic radiation may occur in particular if the optoelectronic arrangement comprises the wavelength-converting material. To increase the brightness contrast, it is expedient in this example for the radiation emission face to be formed below the surface of the potting material.

The potting material may comprise embedded reflective particles. The brightness contrast of the optoelectronic component may advantageously be improved by the reflective particles embedded in the potting material. This is owing to the fact that a part of the electromagnetic radiation that may propagate through the potting material may be scattered at the reflective particles such that overall less electromagnetic radiation may emerge from the potting material.

Our method of producing an optoelectronic component comprises the steps of: a carrier is provided. An optoelectronic arrangement is arranged above a top side of the carrier, wherein the optoelectronic arrangement comprises an optoelectronic semiconductor chip. A sacrificial body is arranged above a radiation emission face of the optoelectronic arrangement. The optoelectronic arrangement and the sacrificial body are embedded into a potting material, wherein a surface of the potting material is formed above the radiation emission face of the optoelectronic arrangement in relation to the top side of the carrier. The sacrificial body is removed.

Advantageously, the radiation emission face is not covered by the potting material if, before arranging the potting material, the sacrificial body is arranged above the radiation emission face. The optoelectronic arrangement and the sacrificial body may be embedded into the potting material such that the surface of the potting material is formed above the radiation emission face in relation to the top side of the carrier.

Arranging the optoelectronic arrangement may comprise arranging a wavelength-converting material on the optoelectronic semiconductor chip. The radiation emission face is constituted of a surface of the wavelength-converting material.

A lamina comprising a photoresist, a salt or a plastic may be used as a sacrificial body. Advantageously, a photoresist, a salt or a plastic may be removed in a simple manner.

Arranging the sacrificial body may comprise: a photoresist is arranged above the top side of the carrier. A section of the photoresist above the radiation emission face is illuminated. An unilluminated section of the photoresist is removed, wherein the illuminated section of the photoresist above the radiation emission face remains and constitutes the sacrificial body.

Removing the sacrificial body may be carried out by dissolving or by plasma ashing. Advantageously, the sacrificial body may be removed in a very simple manner by a dissolving process. Plasma ashing affords the advantage that a use of potentially toxic solvents may be obviated.

Dissolving the sacrificial body may be carried out by water, acetone, sodium hydroxide solution or N-methyl-2-pyrrolidone. Depending on what material the sacrificial body comprises, the corresponding solvent may be used. Water may be used to dissolve a photoresist or a salt. Acetone may be used as solvent if the sacrificial body comprises a plastic. Sodium hydroxide solution and N-methyl-2-pyrrolidone may be suitable solvents for photoresists.

The sacrificial body may be arranged such that a part of the sacrificial body laterally surrounds the radiation emission face. Removing the sacrificial body produces a cavity between the radiation emission face and the potting material. The cavity between the radiation emission face and the potting material affords the advantage that there is a greater difference in refractive index between air and the potting material than, for example, between the wavelength-converting material and the potting material. As a result of the greater difference in refractive index, a smaller part of the electromagnetic radiation may penetrate into the potting material, as a result of which the brightness contrast of the optoelectronic component may be improved.

The sacrificial body may comprise a first sacrificial material and a second sacrificial material. The first sacrificial material is arranged above the radiation emission face. The second sacrificial material is arranged such that it laterally surrounds the radiation emission face. The use of a first sacrificial material and a second sacrificial material may advantageously simplify the production of the cavity.

Before arranging the first sacrificial material, the second sacrificial material may be arranged above the radiation emission face. During or after arranging the first sacrificial material, a pressure is exerted on the first sacrificial material, as a result of which a part of the second sacrificial material passes laterally beyond the radiation emission face and flows toward the carrier such that the second sacrificial material laterally surrounds the radiation emission face.

This example of the method advantageously enables the cavity to be produced in a particularly simple manner. By way of example, a lamina comprising a photoresist may be used as a first sacrificial material, while a liquid photoresist may be used as a second sacrificial material.

The above-described properties, features and advantages and the way in which they are achieved are clearer and more clearly understood in association with the following description of examples that will be explained in greater detail in association with the drawings.

Figure 1:
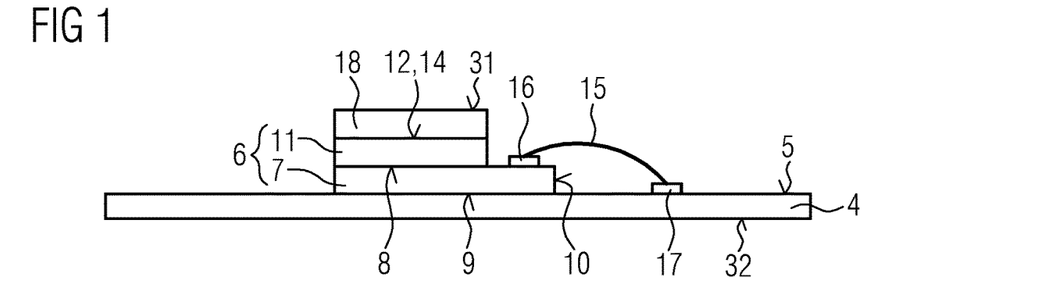
FIG. 1 schematically shows a sacrificial body arranged on an optoelectronic arrangement.
Figure 2:
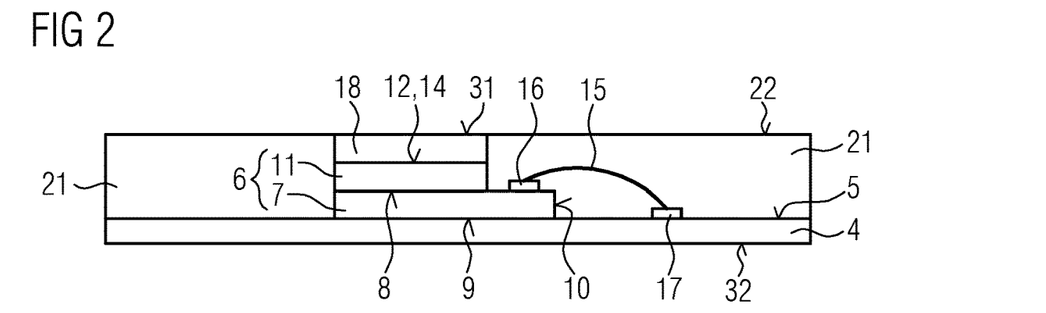
FIG. 2 schematically shows the optoelectronic arrangement and the sacrificial body embedded into a potting material.
Figure 3:
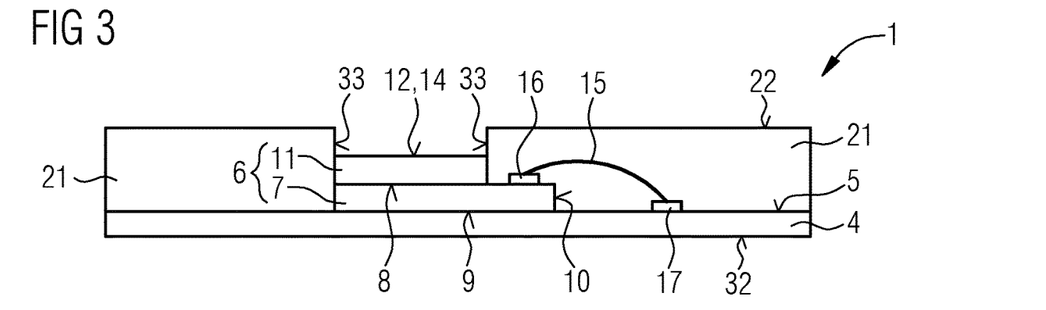
FIG. 3 schematically shows an optoelectronic component in accordance with a first example.

FIGS. 1 to 3 each show in a schematic illustration a method of producing an optoelectronic component 1 in accordance with a first example.

FIG. 1 shows a processing state after a few method steps were carried out.

A carrier 4 comprising a top side 5 was provided. The carrier 4 may comprise, for example, a metal, a semiconductor, a semiconductor oxide, a glass or a ceramic.

An optoelectronic arrangement 6 was arranged above the top side 5 of the carrier 4. The optoelectronic arrangement 6 comprises an optoelectronic semiconductor chip 7. The optoelectronic semiconductor chip 7 comprises a top side 8, an underside 9 and side faces 10. The optoelectronic semiconductor chip 7 was arranged by its underside 9 above the top side 5 of the carrier 4. The optoelectronic semiconductor chip 7 is configured to emit electromagnetic radiation at its top side 8. The optoelectronic semiconductor chip 7 may be formed, for example, as a light emitting diode chip.

The optoelectronic semiconductor chip 7 comprises a semiconductor layer sequence. An active zone is formed within the semiconductor layer sequence. Electromagnetic radiation may be generated within the active zone as a result of charge carrier recombination. To supply the optoelectronic semiconductor chip 7 with an electrical energy for operation, the semiconductor layer sequence has to be electrically contacted above the active zone and below the active zone. For the purpose of electrically contacting the semiconductor layer sequence above the active zone, a first contact element 16 is arranged on the top side 8 of the optoelectronic semiconductor chip 7. The first contact element 16 electrically connects to a second contact element 17 by a bond wire 15. The second contact element 17 is arranged on the top side 5 of the carrier 4. For the purpose of electrically contacting the semiconductor layer sequence below the active zone, the carrier 4 may comprise an electrical conductor track not illustrated in FIG. 1. By way of example, the carrier 4 may be formed as a ceramic circuit board comprising the electrical conductor track. The optoelectronic semiconductor chip 7 comprises, at its underside 9, a third contact element arranged on the electrical conductor track. However, the variant of the electrical contacting of the optoelectronic semiconductor chip 7 as illustrated in FIG. 1 is not absolutely necessary. By way of example, the first contact element 16 and the third contact element may be arranged jointly at the underside 9 of the optoelectronic semiconductor chip 7. In this example, the carrier 4 comprises a respective electrical conductor track for the first contact element 16 and the third contact element. However, it is also possible for the first contact element 16 and the third contact element to be arranged jointly at the top side 8 of the optoelectronic semiconductor chip 7. In this example, the third contact element electrically connects to a fourth contact element by a further bond wire, wherein the fourth contact element is arranged on the top side 5 of the carrier 4.

The optoelectronic arrangement 6 also comprises a wavelength-converting material 11 besides the optoelectronic semiconductor chip 7. The wavelength-converting material 11 was arranged above the top side 8 of the optoelectronic semiconductor chip 7. The wavelength-converting material 11 may comprise, for example, a silicone comprising wavelength-converting particles embedded therein. The wavelength-converting particles may comprise, for example, yttrium aluminum garnet doped with Ce' ions. The wavelength-converting material 11 converts electromagnetic radiation emitted by the optoelectronic semiconductor chip 7 with regard to a wavelength. By way of example, the wavelength-converting material 11 may be configured to convert blue light partially into yellow light. In this example, the optoelectronic arrangement 6 may radiate overall white light.

In the example illustrated in FIG. 1, a radiation emission face 14 of the optoelectronic arrangement 6 is constituted of a surface 12 of the wavelength-converting material 11. This is not absolutely necessary, however. The wavelength-converting material 11 may also be omitted. In this example, the radiation emission face 14 is constituted of the top side 8 of the optoelectronic semiconductor chip 7.

A sacrificial body 18 was arranged above the wavelength-converting material 11. The sacrificial body 18 may comprise, for example, a photoresist, a salt or a plastic. The sacrificial body 18 may be formed, for example, as a lamina of a dry photoresist.

FIG. 2 shows a processing state temporally succeeding FIG. 1 during the process of producing the optoelectronic component 1 in accordance with the first example.

A potting material 21 was arranged above the top side 5 of the carrier 4. The potting material 21 was arranged such that the optoelectronic arrangement 6 and the sacrificial body 18 are embedded into the potting material 21. The potting material 21 comprises a plastic, for example, a silicone. In the exemplary illustration in FIG. 2, the potting material 21 was arranged such that a surface 22 of the potting material 21 lies in one plane with a surface 31 of the sacrificial body 18. This is not absolutely necessary. All that is necessary is that the surface 22 of the potting material 21 is formed above the radiation emission face 14.

The potting material 21 may be arranged above the top side 5 of the carrier 4, for example, by transfer molding, for example, by film-assisted transfer molding. For the purpose of embedding the optoelectronic arrangement 6 and the sacrificial body 18 into the potting material 21, a mold tool is used during the film-assisted transfer molding. The mold tool comprises an upper part and a lower part. The upper part and the lower part of the mold tool enclose a mold cavity. The upper and lower parts of the mold tool comprise an inner wall. At the upper part of the mold tool, a first film is arranged at the inner wall. At the lower part of the mold tool, a second film is arranged at the inner wall. The first and second films may be Teflon films, for example. The potting material 21 is arranged within the mold cavity. So that the top side 31 of the sacrificial body 18 remains free of the potting material 21, the top side 31 of the sacrificial body 18 is pressed against the first film during the process of arranging the potting material 21. An underside 32 of the carrier 4 is pressed against the second film during the film-assisted transfer molding.

FIG. 3 shows a schematic illustration of the finished optoelectronic component 1 in accordance with the first example in a lateral sectional view.

The sacrificial body was removed as a result of which the radiation emission face 14 was uncovered. The sacrificial body may be removed in various ways depending on what material the sacrificial body comprises. If the sacrificial body comprises a photoresist, for instance, then the latter may be water-soluble and dissolved by water. Alternatively, a photoresist may also be dissolved by sodium hydroxide solution or N-methyl-2-pyrrolidone. If the sacrificial body comprises a salt, then the salt may likewise be dissolved by water. If the sacrificial body comprises a plastic, then it may be removed by acetone, for example. As an alternative to dissolving the sacrificial body by a solvent, removing the sacrificial body may also be carried out by plasma ashing. The method of plasma ashing may be used if the sacrificial body comprises a photoresist. During plasma ashing, a microwave-excited oxygen plasma is used to decompose and/or oxidize the photoresist, with gaseous reaction products arising.

The radiation emission face 14 is formed below the surface 22 of the potting material 21 in relation to the top side 5 of the carrier 4. During operation of the optoelectronic arrangement 6, a part of the electromagnetic radiation radiated at the radiation emission face 14 may penetrate into the potting material 21. This is in particular if the optoelectronic arrangement 6 comprises the wavelength-converting material 11. By the fact that a part of the electromagnetic radiation must propagate through the potting material 21, a part of the electromagnetic radiation propagating through the potting material 21 may be absorbed. As a result, only a part of the electromagnetic radiation that has penetrated into the potting material 21 may emerge from the potting material 21 at the surface 22. This makes it possible to improve a brightness contrast between the radiation emission face 14 and the surface 22 of the potting material 21 surrounding the radiation emission face 14.

Alternatively, the brightness contrast may furthermore be optimized by the potting material 21 comprising embedded reflective particles. The reflective particles may comprise, for example, silicon dioxide or titanium dioxide. By virtue of the reflective particles embedded into the potting material 21, electromagnetic radiation emitted at the radiation emission face 14 may be reflected at a wall 33 of the potting material 21, the wall being formed perpendicularly to the surface 22 of the potting material 21. This makes it possible for the electromagnetic radiation to be radiated substantially above the radiation emission face 14.

Figure 4:
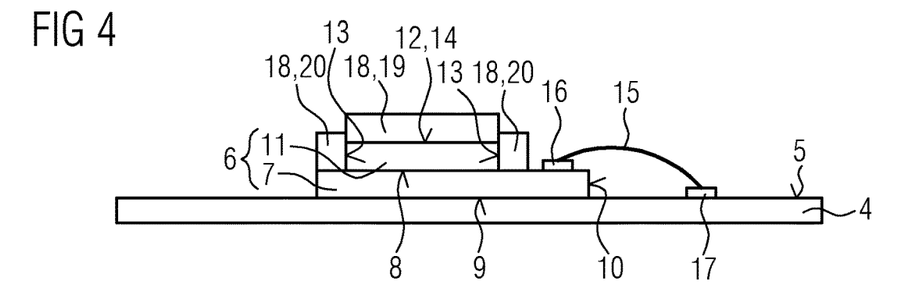
FIG. 4 schematically shows a sacrificial body laterally surrounding a radiation emission face of an optoelectronic arrangement.
Figure 5:
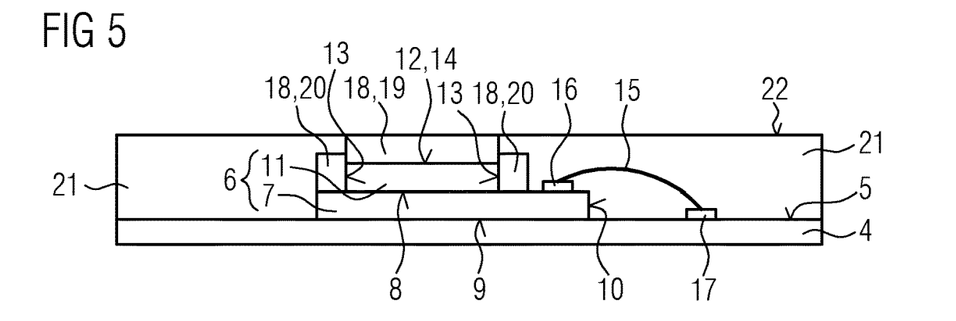
FIG. 5 schematically shows the optoelectronic arrangement and the sacrificial body embedded into a potting material.
Figure 6:
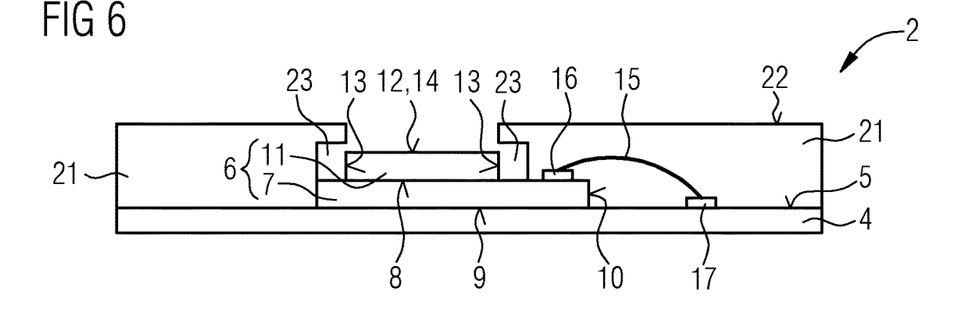
FIG. 6 schematically shows an optoelectronic component in accordance with a second example.

FIGS. 4 to 6 show various processing states when producing an optoelectronic component 2 in accordance with a second example. The optoelectronic component 2 in accordance with the second example comprises a great similarity with the optoelectronic component 1 in accordance with the first example. Only the differences between the optoelectronic component 2 and the optoelectronic component 1 are explained in the description below.

FIG. 4 shows a first processing state when producing the optoelectronic component 2 in accordance with the second example.

The sacrificial body 18 was arranged such that a part of the sacrificial body 18 laterally surrounds the radiation emission face 14. In the example illustrated in FIG. 4, a first sacrificial material 19 of the sacrificial body 18 was arranged exclusively above the radiation emission face 14, while a second sacrificial material 20 of the sacrificial body 18 was arranged such that the second sacrificial material 20 laterally surrounds the radiation emission face 14. This is not absolutely necessary, however. It is also possible for the sacrificial body 18 to comprise only one sacrificial material. In this example, a continuous sacrificial body 18 has been arranged such that a part of the sacrificial body 18 is arranged above the radiation emission face 14 and a part of the sacrificial body 18 laterally surrounds the radiation emission face 14.

The first sacrificial material 19 may be, for example, a lamina comprising a photoresist. The second sacrificial material 20 may be, for example, a liquid photoresist. In this example, before arranging the first sacrificial material 19 above the radiation emission face 14, the second sacrificial material 20 is arranged above the radiation emission face 14. During or after arranging the first sacrificial material 19 above the radiation emission face 14 and the second sacrificial material 20, a pressure is exerted on the first sacrificial material 19, as a result of which a part of the second sacrificial material 20 passes laterally beyond the radiation emission face 14 and flows toward the top side 5 of the carrier 4 such that the second sacrificial material 20 laterally surrounds the radiation emission face 14.

FIG. 5 shows a processing state temporally succeeding FIG. 4 when producing the optoelectronic component 2 in accordance with the second example.

As when producing the optoelectronic component 1 in accordance with the first example, the optoelectronic arrangement 6 and the sacrificial body 18 were embedded into the potting material 21. In this example, too, arranging the potting material 21 may be carried out, for example, by film-assisted transfer molding.

FIG. 6 shows the optoelectronic component 2 in accordance with the second example in a schematic and lateral sectional view.

The first sacrificial material 19 and the second sacrificial material 20 of the sacrificial body 18 were removed. By virtue of the fact that the second sacrificial material 20 laterally surrounded the radiation emission face 14, removing the second sacrificial material 20 produced a cavity 23 between the radiation emission face 14 and the potting material 21. Compared to the first example of the optoelectronic component 1, in the optoelectronic component 2 in accordance with the second example, there is a greater difference in refractive index with regard to electromagnetic radiation entering the potting material 21. Instead of the electromagnetic radiation passing from the wavelength-converting material 11 into the potting material 21, the situation now present is that the electromagnetic radiation must pass from the cavity 23 filled with air into the potting material 21. As a result of the greater difference in refractive index, the optoelectronic component 2 may comprise an improved brightness contrast.

FIGS. 7 to 13 show various processing states when producing an optoelectronic component 3 in accordance with a third example.

Figure 7:
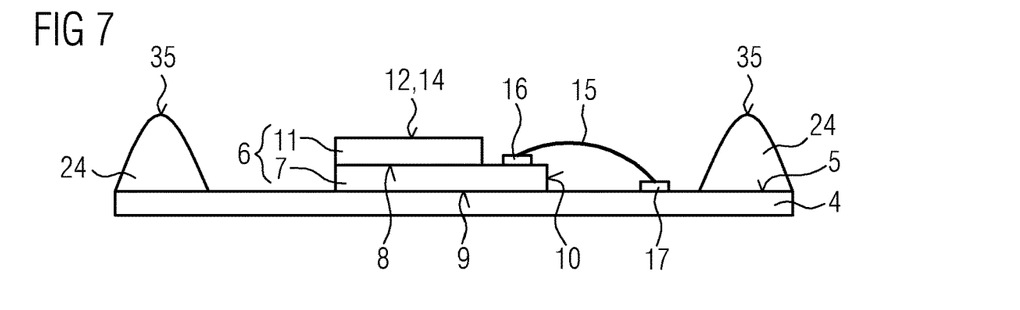
FIG. 7 schematically shows an optoelectronic arrangement laterally surrounded by a dam.

FIG. 7 shows a first processing state when producing the optoelectronic component 3 in accordance with the third example.

The optoelectronic arrangement 6 was arranged above the top side 5 of the carrier 4. Next to the optoelectronic arrangement 6, a dam 24 was arranged above the top side 5 of the carrier 4. The dam 24 was arranged such that it laterally surrounds the optoelectronic arrangement 6. The dam 24 may comprise a plastic, for example, a silicone or an epoxy.

Figure 8:
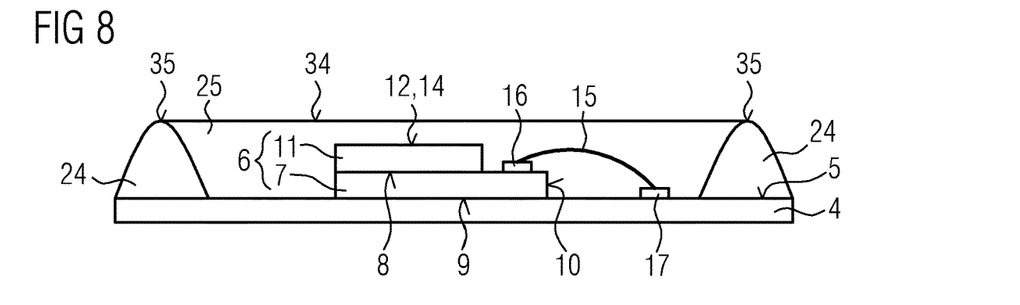
FIG. 8 schematically shows the optoelectronic arrangement embedded into a photoresist.

FIG. 8 shows a processing state succeeding FIG. 7 when producing the optoelectronic component 3 in accordance with the third example.

A photoresist 25 was arranged above the top side 5 of the carrier 4 such that the optoelectronic arrangement 6 is embedded into the photoresist 25. In this example, the photoresist 25 was arranged within the dam 24. In this example, the photoresist 25 was arranged as far as an upper edge 35 of the dam 24. This is not absolutely necessary. What is necessary, however, is that the photoresist 25 is arranged such that a surface 34 of the photoresist 25 is formed above the radiation emission face 14 in relation to the top side 5 of the carrier 4.

Figure 9:
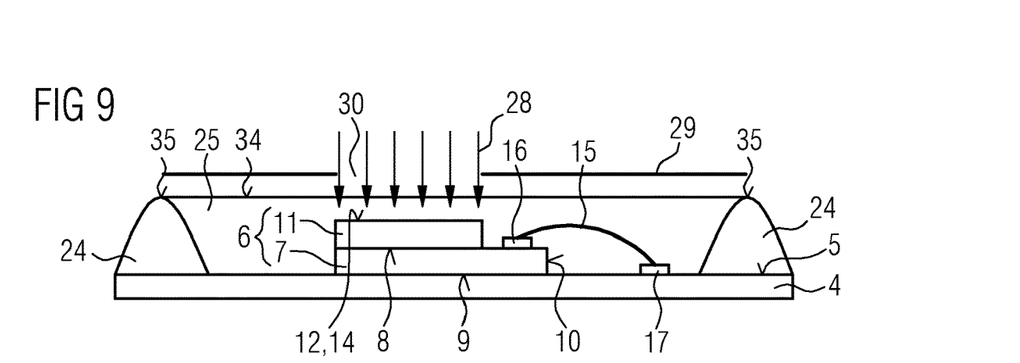
FIG. 9 schematically shows a process of illuminating a section of the photoresist above a radiation emission face of the optoelectronic arrangement.

FIG. 9 shows a processing step temporally succeeding FIG. 8 when producing the optoelectronic component 3 in accordance with the third example.

A shadow mask 29 is used to illuminate the photoresist 25 with electromagnetic radiation 28. The shadow mask 29 comprises an opening 30, through which the electromagnetic radiation 28 may impinge on the photoresist 25. The shadow mask 29 is positioned above the photoresist 25 such that the opening 30 is arranged exclusively above the radiation emission face 14. In this way, the electromagnetic radiation 28 impinges only on a section of the photoresist 25 formed above the radiation emission face 14. The electromagnetic radiation 28 may be UV radiation, for example. The photoresist 25 may polymerize as a result of the illumination of the photoresist 25 above the radiation emission face 14. The photoresist 25 is thus a negative resist.

Figure 10:
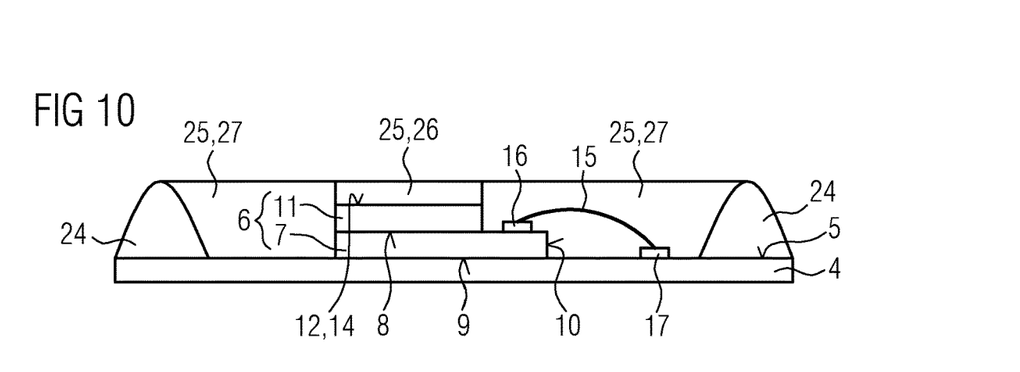
FIG. 10 schematically shows a sacrificial body produced by the process of illuminating the photoresist.

FIG. 10 shows the result of the illumination of the photoresist 25 in a schematic lateral sectional view.

An illuminated section 26 of the photoresist 25 is polymerized as a result of the illumination of the photoresist 25 above the radiation emission face 14. By contrast, an unilluminated section 27 of the photoresist 25 is not polymerized. The illuminated section 26 of the photoresist 25 is provided to constitute the sacrificial body 18.

Figure 11:
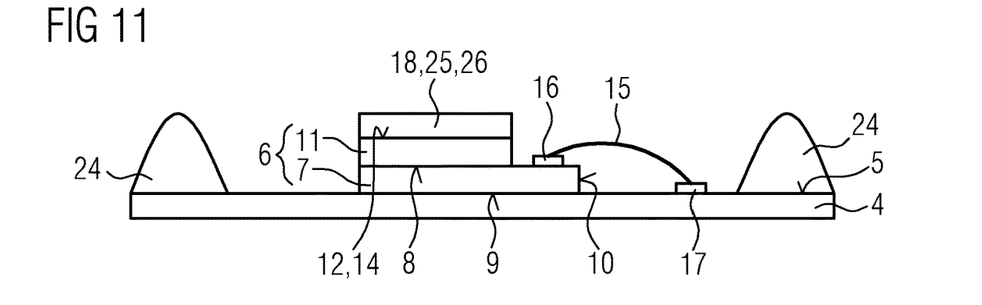
FIG. 11 schematically shows the illuminated section of the photoresist that remained above the radiation emission face after an unilluminated section of the photoresist had been removed.

FIG. 11 shows a processing state succeeding FIG. 10 when producing the optoelectronic component 3 in accordance with the third example.

The unilluminated section 27 of the photoresist 25 was removed. Only the illuminated section 26 of the photoresist 25 above the radiation emission face 14 remains as a result. The illuminated section 26 of the photoresist 25 is polymerized and constitutes the sacrificial body 18.

Figure 12:
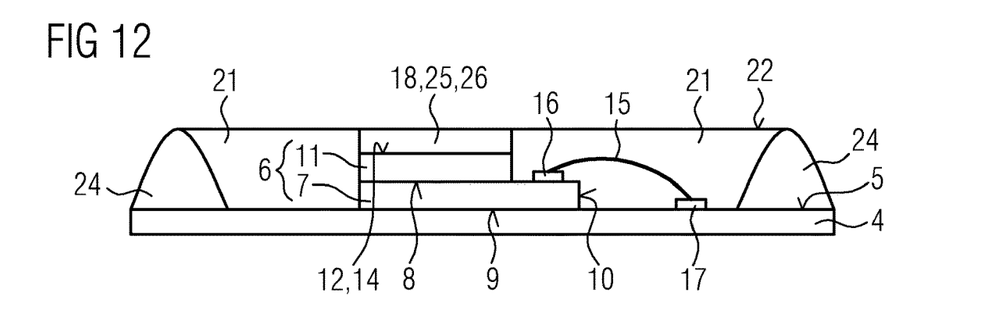
FIG. 12 schematically shows the optoelectronic arrangement and the sacrificial body produced as a result of the process of illuminating, which are embedded into a potting material.

FIG. 12 shows a processing state temporally succeeding FIG. 11 when producing the optoelectronic component 3 in accordance with the third example.

The potting material 21 was arranged above the top side 5 of the carrier 4 and within the dam 24 and embeds the optoelectronic arrangement 6 and the sacrificial body 18. It may be the case that the dam 24 is likewise removed during the process of removing the unilluminated section 27 of the photoresist 25. In this example, a further dam may be arranged on the carrier 4 before the potting material 21 is arranged.

Figure 13:
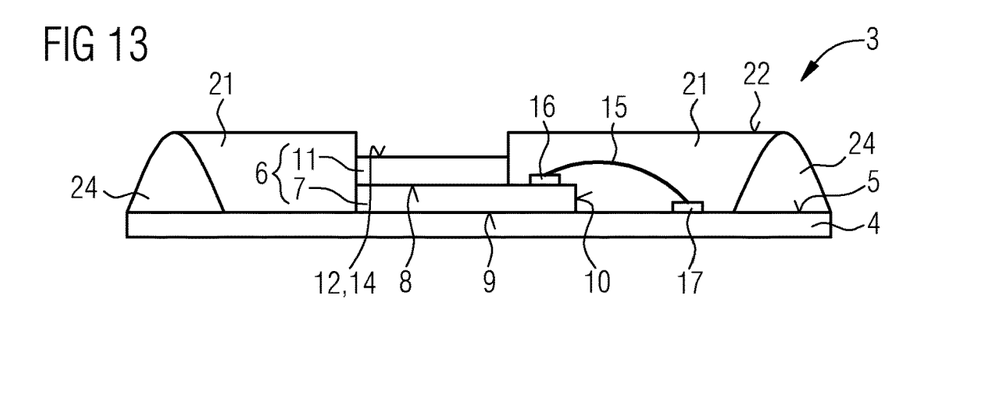
FIG. 13 schematically shows an optoelectronic component in accordance with a third example.

FIG. 13 shows the finished optoelectronic component 3 in accordance with the third example in a schematic lateral sectional view.

The sacrificial body 18 produced by illumination of the photoresist 25 was removed. The radiation emission face 14 was uncovered as a result. The radiation emission face 14 is formed below the surface 22 of the potting material 21 in relation to the top side 5 of the carrier 4.

The optoelectronic components 1, 2, 3 in accordance with the first, second and third examples each comprise only one optoelectronic arrangement 6. This is not absolutely necessary. The optoelectronic components 1, 2, 3 may also comprise a plurality of optoelectronic arrangements 6. If a plurality of optoelectronic arrangements 6 are used, then it is possible to singulate the optoelectronic arrangements 6 embedded into the potting material 21. The singulation may be carried out by a sawing process, for example. Individual units comprising at least one optoelectronic arrangement 6 may be produced as a result.

Our components and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2018 104 381.3, the subject matter of which is incorporated herein by reference.

The invention claimed is:

1. A method of producing an optoelectronic component comprises:
   providing a carrier,
   arranging an optoelectronic arrangement above a top side of the carrier, wherein the optoelectronic arrangement comprises an optoelectronic semiconductor chip,
   arranging a sacrificial body above a radiation emission face of the optoelectronic arrangement,
   embedding the optoelectronic arrangement and the sacrificial body into a potting material, wherein a surface of the potting material is formed above the radiation emission face of the optoelectronic arrangement in relation to the top side of the carrier, and
   removing the sacrificial body.

2. The method according to claim 1,
   wherein arranging the optoelectronic arrangement comprises arranging a wavelength-converting material on the optoelectronic semiconductor chip, and
   the radiation emission face is constituted of a surface of the wavelength-converting material.

3. The method according to claim 1, wherein a lamina comprising a photoresist, a salt or a plastic is used as sacrificial body.

4. The method according to claim 1, wherein arranging the sacrificial body comprises:
   arranging a photoresist above the top side of the carrier,
   illuminating a section of the photoresist above the radiation emission face, and
   removing unilluminated sections of the photoresist, wherein the illuminated section of the photoresist above the radiation emission face remains and constitutes the sacrificial body.

5. The method according to claim 1, wherein removing the sacrificial body is carried out by dissolving the sacrificial body or subjecting it to plasma asking.

6. The method according to claim 5, wherein dissolving the sacrificial body is carried out by water, acetone, sodium hydroxide solution or N-methyl-2-pyrrolidone.

7. The method according to claim 1,
   wherein the sacrificial body is arranged such that a part of the sacrificial body laterally surrounds the radiation emission face, and
   removing the sacrificial body produces a cavity between the radiation emission face and the potting material.

8. The method according to claim 7,
   wherein the sacrificial body comprises a first sacrificial material and a second sacrificial material,
   the first sacrificial material is arranged above the radiation emission face, and the second sacrificial material is arranged such that it laterally surrounds the radiation emission face.

9. The method according to claim 8, wherein, before arranging the first sacrificial material, the second sacrificial material is arranged above the radiation emission face, and during or after arranging the first sacrificial material, a pressure is exerted on the first sacrificial material, as a result of which a part of the second sacrificial material passes laterally beyond the radiation emission face and flows toward the top side of the carrier such that the second sacrificial material laterally surrounds the radiation emission face.

\* \* \* \* \*